(12) United States Patent
Eguchi et al.

(10) Patent No.: US 8,095,836 B2
(45) Date of Patent: Jan. 10, 2012

(54) TIME-BASED TECHNIQUES FOR DETECTING AN IMMINENT READ FAILURE IN A MEMORY ARRAY

(75) Inventors: Richard K. Eguchi, Austin, TX (US);
Thomas S. Harp, Austin, TX (US);
Thomas Jew, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 77 days.

(21) Appl. No.: 12/608,476

(22) Filed: Oct. 29, 2009

(65) Prior Publication Data

US 2011/0107160 A1    May 5, 2011

(51) Int. Cl.
*G11C 29/42* (2006.01)
*G11C 29/50* (2006.01)

(52) U.S. Cl. ........................ 714/723; 714/746
(58) Field of Classification Search .................. None
See application file for complete search history.

(56) References Cited

U.S. PATENT DOCUMENTS

| | | | |
|---|---|---|---|
| 6,226,200 B1 | 5/2001 | Eguchi et al. | |
| 7,370,260 B2 * | 5/2008 | Nahas | 714/763 |
| 7,450,425 B2 | 11/2008 | Aritome | |
| 2005/0120265 A1 * | 6/2005 | Pline et al. | 714/7 |
| 2008/0120526 A1 | 5/2008 | Eguchi et al. | |

\* cited by examiner

*Primary Examiner* — Jeffrey A Gaffin
*Assistant Examiner* — Dipakkumar Gandhi
(74) *Attorney, Agent, or Firm* — Yudell Isidore Ng Russell PLLC

(57) ABSTRACT

A technique for detecting an imminent read failure in a memory array includes determining a first incident count for a memory array that does not exhibit an uncorrectable error correcting code (ECC) read during an array integrity check. In this case, the first incident count corresponds to an initial number of ECC corrections that are performed when the array integrity check of the memory array initially fails. The technique also includes determining a current count for the memory array when the memory array does not exhibit an uncorrectable ECC read during subsequent array integrity checks. In this case, the current count corresponds to a subsequent number of error correcting code (ECC) corrections required during the subsequent array integrity checks. An indication of an imminent read failure for the memory array is provided when the current count exceeds the first incident count by a predetermined amount.

20 Claims, 6 Drawing Sheets ated ECCs, allows a single-bit error to be detected and corrected and (in the usual configuration, with an extra parity bit) double-bit errors to be detected (but not corrected). Various memory controllers are designed to support ECC. However, motherboards employed in low-cost computer systems typically do not support ECC. Most low-cost ECC-capable memory controllers only detect and correct single-bit errors of a word, e.g., a 64-bit word, and detect (but not correct) errors of two bits per word. For example, an ECC word checkbase for a 64-bit word may include seventy-two bits (i.e., sixty-four natural bits and eight parity bits). Other ECC-capable memory controllers are capable of detecting and correcting multiple bits per word.

TIME-BASED TECHNIQUES FOR DETECTING AN IMMINENT READ FAILURE IN A MEMORY ARRAY

CROSS-REFERENCE TO RELATED APPLICATIONS

The present application is related to commonly assigned U.S. patent application Ser. No. 12/608,405, entitled "THRESHOLD VOLTAGE TECHNIQUES FOR DETECTING AN IMMINENT READ FAILURE IN A MEMORY ARRAY," by Richard K. Eguchi et al., which was filed on even date herewith and is incorporated herein by reference in its entirety for all purposes.

BACKGROUND

1. Field

This disclosure relates generally to detecting an imminent read failure in a memory array and, more specifically, to time-based techniques for detecting an imminent read failure in a memory array.

2. Related Art

A soft memory error (e.g., attributable to electrical or magnetic interference) can cause one or more memory (bit) cells of a random access memory (RAM) module of a computer system to spontaneously flip to a non-written state. The majority of soft errors in RAM modules occur as a result of background radiation that changes the contents of one or more bit cells, or interferes with circuitry used to read/write the bit cells. Soft errors may be mitigated by using RAM modules that include extra memory bits and memory controllers that exploit the extra memory bits. The extra bits may be used to record parity or implement an error correcting code (ECC). Similarly, hard errors (i.e., errors that are not transient) in RAM modules may also be corrected using ECC. In general, parity allows for the detection of a single-bit error. Hamming code, which is one of the most commonly implemented ECCs, allows a single-bit error to be detected and corrected and (in the usual configuration, with an extra parity bit) double-bit errors to be detected (but not corrected). Various memory controllers are designed to support ECC. However, motherboards employed in low-cost computer systems typically do not support ECC. Most low-cost ECC-capable memory controllers only detect and correct single-bit errors of a word, e.g., a 64-bit word, and detect (but not correct) errors of two bits per word. For example, an ECC word checkbase for a 64-bit word may include seventy-two bits (i.e., sixty-four natural bits and eight parity bits). Other ECC-capable memory controllers are capable of detecting and correcting multiple bits per word.

The basic input/output system (BIOS) in some computer systems, as well as some operating systems (OSs), e.g., Linux, allow for counting of detected and corrected memory errors, in part to help identify failing memory modules before a problem becomes catastrophic (i.e., before memory errors become uncorrectable). Error detection and correction depends on an expectation of the kinds of errors that occur. As long as the number of bits in any particular word does not exceed the number of bits that an implemented ECC can correct, a memory system presents the illusion of an error-free memory system.

ECC has also been employed in non-volatile memory (NVM) applications. For example, embedded NVM (eNVM) employed in automotive applications has implemented ECC to correct read failures. In general, a read failure occurs when what was programmed into a bit cell (data or code) is not read out of the bit cell. For example, in a typical NVM (e.g., a Flash memory) a digital one and a digital zero in a bit cell are indicated by a different charge. For example, a cell that is charged may indicate a digital zero and a cell that is not charged may indicated a digital one. An NVM bit cell can gain or lose electrons if the bit cell is defective. In a typical NVM, a bit cell error is a hard error. That is, in a typical NVM, a bit cell that gains electrons will not subsequently lose electrons. Similarly, in a typical NVM, a bit cell that loses electrons will not subsequently gain electrons.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
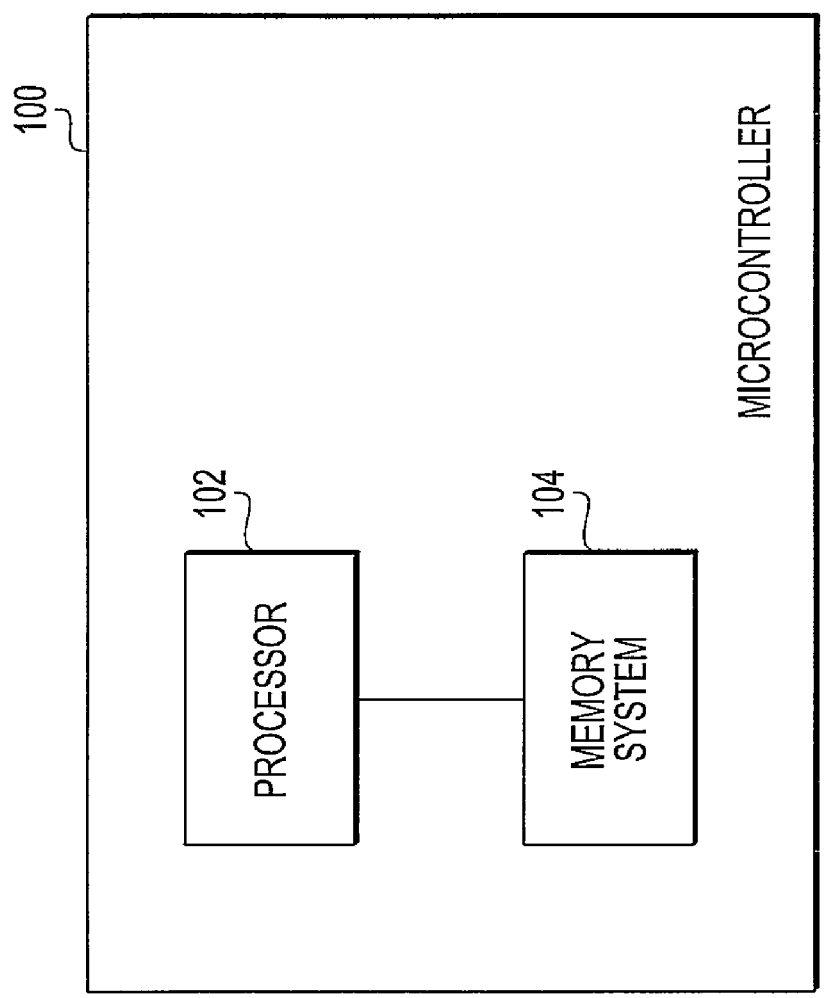
FIG. 1 is a diagram of an example system (in this case a microcontroller) that includes a processor and a memory system configured according to the present invention.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined only by the appended claims and their equivalents. In particular, although the preferred embodiment is described below in conjunction with a microcontroller, it will be appreciated that the present invention is not so limited and may potentially be embodied in various systems that include a memory array that is subject to read failures.

Today, it is a relatively common practice for various systems to implement error correcting code (ECC) memory. Although ECC cannot protect against catastrophic failure, ECC (depending on the implementation) is generally effective in correcting bit/column errors. The techniques disclosed herein are substantially independent of technology and may be used on any memory that includes a memory (bit) cell that drifts with part usage. In general, a bit in a defective non-volatile memory (NVM) bit cell moves toward a normal read verify voltage level and eventually is read incorrectly. In order to approach zero defects in safety critical applications (e.g., automotive microcontroller applications, such as braking systems, airbag systems, collision avoidance systems, and rollover avoidance systems), it is desirable to predict an uncorrectable read of an NVM employed in the safety critical application in order to facilitate imminent failure notification.

In general, customers are comfortable with error correction capabilities employed to correct NVM errors. However, customers generally desire to have the ability to identify whether an uncorrectable read of an NVM (which could result in an accident when employed in an automotive application) may occur during operation of a safety critical application. According to various aspects of the present disclosure, techniques are implemented to determine if an uncorrectable ECC read failure, i.e, imminent read failure, is approaching when an ECC correction is detected. The techniques may be readily employed to detect imminent read failures on NVMs (e.g., embedded NVMs) that implement ECC as part of a read path. In various embodiments, the techniques utilize a post ECC path read and a read at a margin threshold voltage (Vt) level to detect imminent read failures. The techniques may, for example, be implemented within user mode diagnostics to identify imminent read failures.

For example, when an ECC implementation is only capable of single-bit correction, the ECC provides protection against the first failing bit in a group of bits (i.e., an ECC word checkbase) but cannot correct multiple failing bits in the ECC word checkbase. A single-bit ECC correction may not be an accurate indication of imminent read failure of an NVM and may result in functional parts being returned to a vendor. According to an embodiment of the present disclosure, ECC is combined with a margin read that is confined to an ECC word checkbase (with a pre-existing ECC correction) to provide accurate techniques for predicting an imminent read failure of an NVM. While the discussion herein is primarily directed to single-bit ECC correction and double-bit ECC detection, it should be appreciated that the techniques disclosed herein are applicable to multiple-bit ECC correction and detection. Moreover, while the discussion herein is primarily directed to automotive applications, it should be appreciated that the techniques disclosed herein are not limited to a particular field.

As one example, a circuit may be implemented that includes: an address sequencer; an ECC circuit; and a threshold voltage level adjuster. In this case, the address sequencer is used to read all locations within an NVM. For example, an array integrity (AI) check may be performed by implementing (in conjunction with the address sequencer) a multiple input signature register (MISR), which performs an algorithm on a sequence of read data to provide signatures for the sequence of read data at various times. The AI check then compares subsequent signatures of the sequence of read data (when read at a later point in time) to an initial signature to identify read failures. The ECC circuit identifies whether a read needed a correction to pass (as well as identifying whether a read could not be corrected due to too many failures in the ECC word checkbase). The threshold voltage level adjuster is then used to perform a read at one or more read margin levels.

The threshold voltage level adjuster is a circuit that changes a gate voltage (above, below, or above and below a normal read verify voltage) of a field-effect transistor (FET) of a bit cell such that a read can be performed at a desired margin read verify voltage level. In this case, a drain of the FET may be set to about 1.0 volt and a source of the FET may be grounded. The threshold voltage adjuster may be implemented with, for example, a resistor tree whose output voltage is controlled through a register write (to a resistor tree register) to select a desired notch on the resistor tree. For example, if a gate voltage for a normal read is 4.0 volts, a gate voltage for a margin read may be 4.3 volts. As another example, if a gate voltage for a normal read is 4.0 volts, a gate voltage for a margin read may be 3.8 volts. By varying a gate voltage above and below a gate voltage for a normal read, different errors may be detected. In either case, the margin read data is fed to the ECC to see if any resulting error is correctable. If any resulting error is correctable, an imminent read failure is not indicated. On the other hand, if any resulting error is not correctable, an imminent read failure is indicated. For example, an imminent read failure may be indicated for a single-bit ECC approach when two or more bits fail to read correctly at a margin read verify voltage level. In an alternative embodiment, the threshold voltage level adjuster may implement a current-based approach. The threshold voltage technique may also be utilized to identify the least erased or least programmed bits in a memory array.

According to one embodiment of the present disclosure, a technique for detecting an imminent read failure in a memory array includes determining a first incident count for a memory array that does not exhibit an uncorrectable error correcting code (ECC) read during an array integrity check. In this case, the first incident count corresponds to an initial number of ECC corrections that are performed when the first array integrity check of the memory array initially fails. The first incident count may then be written to a dedicated non-volatile storage location to preserve the first incident count for later use. The method also includes determining a current count for the memory array when the memory array does not exhibit an uncorrectable ECC read during subsequent array integrity checks. In this case, the current count corresponds to a subsequent number of error correcting code (ECC) corrections required during the subsequent array integrity checks. An indication of an imminent read failure for the memory array is provided when the current count exceeds the first incident count (which may be retrieved from the dedicated non-volatile storage location) by a predetermined amount.

According to another embodiment of the present disclosure, a technique for detecting an imminent read failure in a memory array includes determining whether an array integrity check on the memory array passed without using error correcting code (ECC) correction. The technique also includes determining, when the array integrity check on the memory array did not pass without using the ECC correction, whether the memory array is ECC correctable. When the memory array is ECC correctable, a first incident count for the memory array is determined. In this case, the first incident count corresponds to an initial number of ECC corrections that are performed when the array integrity check of the memory array initially fails. The first incident count may then be written to a dedicated non-volatile storage location to preserve the first incident count for later use. While the memory array is ECC correctable, a current count is determined for the memory array during subsequent array integrity checks. In this case, the current count corresponds to a subsequent number of error correcting code (ECC) corrections required during the subsequent array integrity checks. An indication of an imminent read failure for the memory array is provided when the current count exceeds the first incident count (which may be retrieved from the dedicated non-volatile storage location) by a predetermined amount.

According to yet another embodiment of the present disclosure, a memory system includes a non-volatile memory array and a circuit coupled to the non-volatile memory array. The circuit is configured to determine whether an array integrity check on the memory array passed without using error correcting code (ECC) correction. The circuit is also configured to determine, when the array integrity check on the memory array did not pass without using the ECC correction, whether the memory array is ECC correctable. The circuit is further configured to determine, when the memory array is ECC correctable, a first incident count for the memory array. In this case, the first incident count corresponds to an initial number of ECC corrections that are performed when the array integrity check of the memory array initially fails. The first incident count may then be written to a dedicated non-volatile storage location to preserve the first incident count for later use. The circuit is also configured to determine, while the memory array is ECC correctable, a current count for the memory array during subsequent array integrity checks. In this case, the current count corresponds to a subsequent number of ECC corrections required during the subsequent array integrity checks. The circuit is further configured to provide an indication of an imminent read failure for the memory array when the current count exceeds the first incident count (which may be retrieved from the dedicated non-volatile storage location) by a predetermined amount.

With reference to FIG. 1, an example microcontroller 100 is illustrated that includes a processor 102 and a memory system 104 coupled to the processor 102. The memory system 104 is configured to include an ECC circuit and a margin circuit (see FIG. 5). The memory system 104 may also be configured to include an address sequencer and a threshold voltage level adjuster (not separately shown). Alternatively, the address sequencer and the threshold voltage level adjuster may be located in one or more different functional blocks. As noted above, the address sequencer is used to read all locations within an NVM. For example, an array integrity (AI) check may be performed by implementing a multiple input signature register (MISR), which performs an algorithm on a sequence of read data to provide signatures for the sequence of read data at various times. The AI check is configured to compare subsequent signatures of the sequence of read data (when read at a later point in time) to an initial signature to identify read failures. As is also noted above, the threshold voltage level adjuster is used to perform a read at a margin read verify voltage level.

Figure 2:
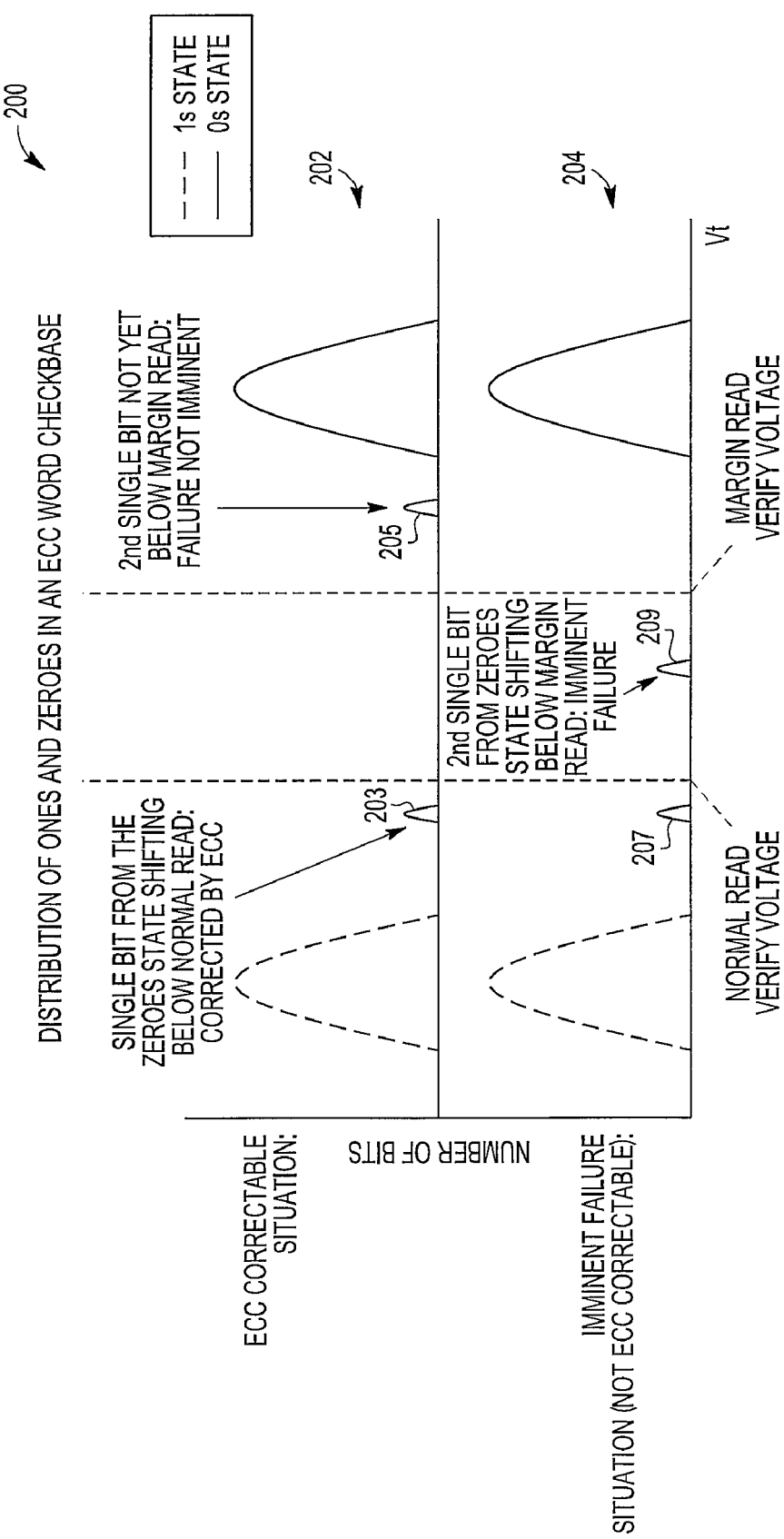
FIG. 2 is an example graph for an error correcting code (ECC) word checkbase that illustrates an ECC correctable situation and an ECC uncorrectable situation in which an imminent read failure is indicated.

With reference to FIG. 2, a graph 200 depicts a distribution of ones and zeroes in an ECC word checkbase. In this example, bits with threshold voltage values above a normal read verify voltage level read as logical zeroes and bits with threshold voltage values lower than the normal read verify voltage level read as logical ones. As is shown, upper graph section 202 illustrates an ECC correctable situation in which a first single bit 203 (that has shifted from a zeroes state to below the normal read verify voltage level) is corrected by an ECC and a second single bit 205 that has not yet shifted below a margin read verify voltage level and, as such, does not indicate an imminent read failure. In contrast, lower graph section 204 illustrates an ECC correctable situation in which a first single bit 207 (that has shifted below a normal read verify voltage level) is corrected by the ECC and a second single bit 209 that has shifted below a margin read verify voltage level and, as such, indicates an imminent read failure for a memory array that includes an ECC that can only correct a single-bit.

Figure 3:
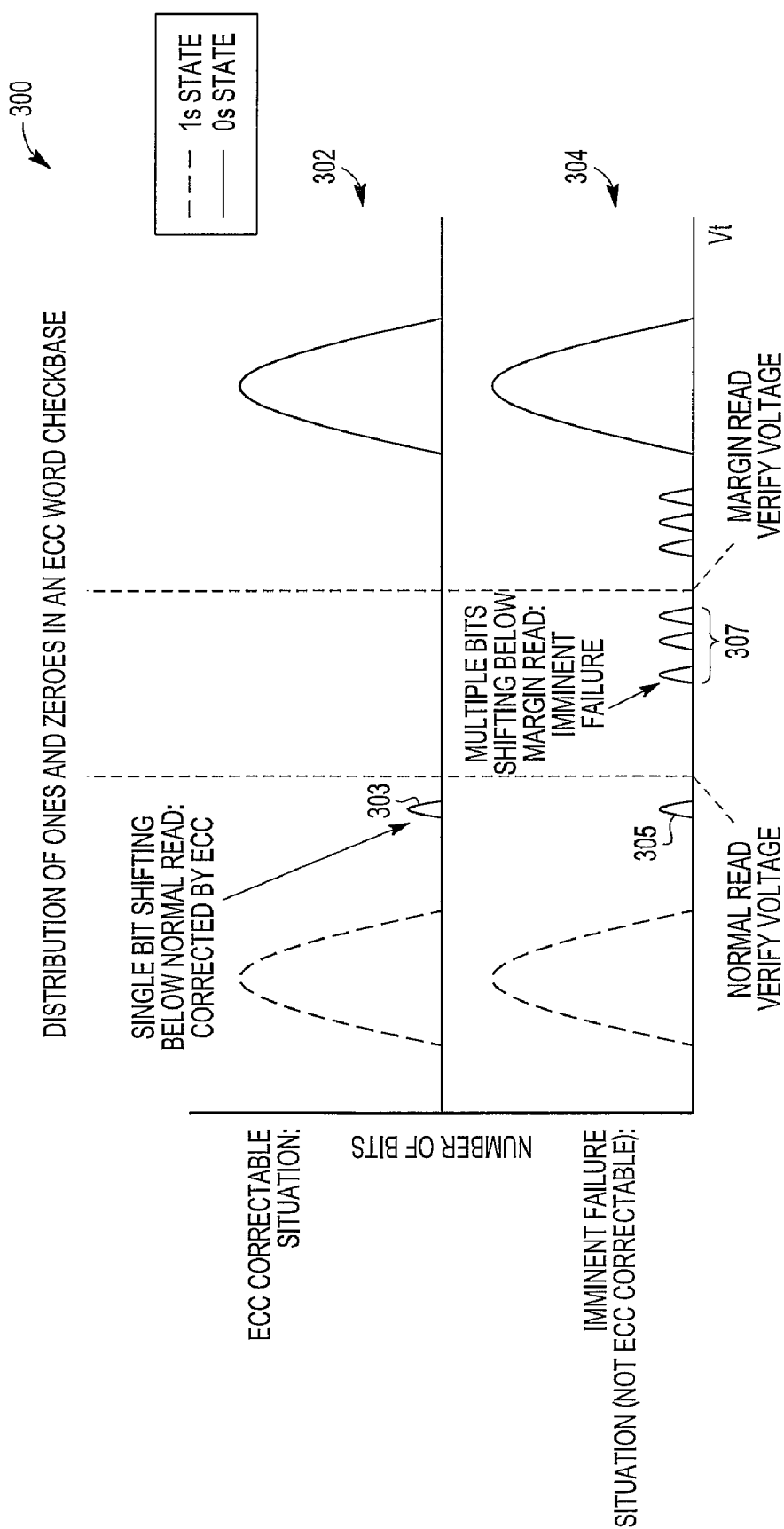
FIG. 3 is another example graph for an ECC word checkbase that illustrates an ECC correctable situation and an ECC uncorrectable situation in which an imminent read failure is indicated.

With reference to FIG. 3, a graph 300 depicts another distribution of ones and zeroes in an ECC word checkbase. As is shown, upper graph section 302 illustrates an ECC correctable situation in which a first single bit 303 (that has shifted below a normal read verify voltage level) is corrected by the ECC and, as such, an imminent read failure is not indicated. In contrast, lower graph section 304 illustrates an ECC correctable situation in which a first single bit 305 (that has shifted below a normal read verify voltage level) is corrected by the ECC and multiple bits 307 (that have shifted below a margin read verify voltage level) indicate an imminent read failure for a memory array that includes an ECC that can only correct a single-bit.

Figure 4:
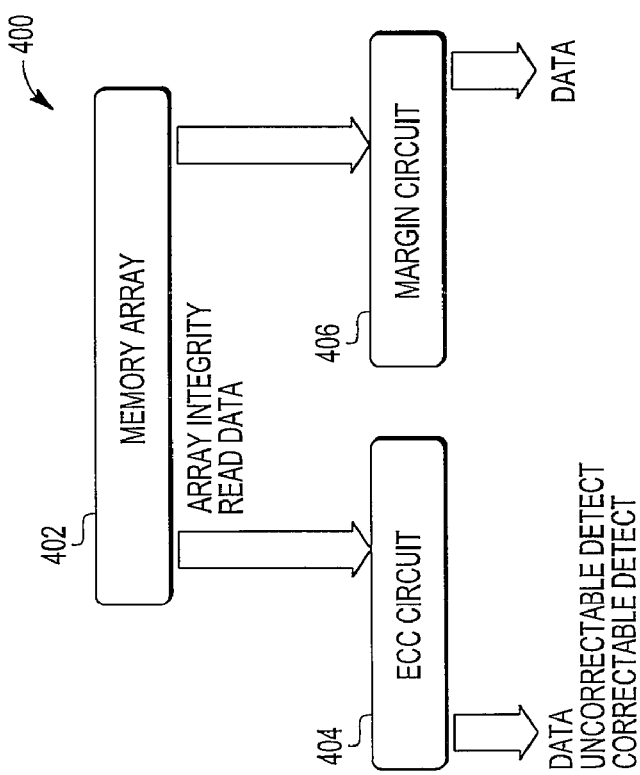
FIG. 4 is a diagram of a conventional memory system that employs an ECC circuit and a margin circuit.

Turning to FIG. 4, a conventional memory system 400 is illustrated that includes a memory array 402 (e.g., a NVM) having an ECC circuit 404 in a read path of the memory array 402. As is also shown, the memory system 400 includes a margin circuit 406 that is utilized to determine whether bit cells of the memory array 402 pass at a margin read verify voltage level. It should be appreciated that an output of the margin circuit 406 is not coupled to an input of the ECC circuit 402. As such, the ECC circuit 402 is not available to determine whether a read failure (as indicated by an output of the margin circuit 406) is correctable.

Figure 5:
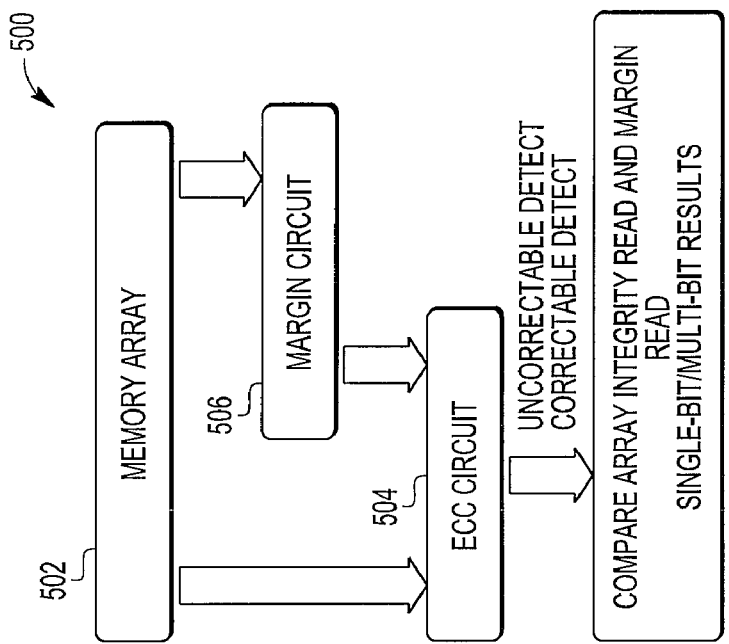
FIG. 5 is a diagram of a memory system that employs an ECC circuit and a margin circuit according to various embodiments of the present invention.

With reference to FIG. 5, a memory system 500 is illustrated that also includes a memory array 502 having an ECC circuit 504 in a read path of the memory array 502. As is also shown, the memory system 500 includes a margin circuit 506 that is utilized to determine whether bit cells of the memory array 502 pass at a margin read verify voltage level, which may be above, below, or above and below a normal read verify voltage level. It should be appreciated that an output of the margin circuit 506 is coupled to an input of the ECC circuit 502. As such, the ECC circuit 502 is available to determine whether a read failure (as indicated by an output of the margin circuit 506) is correctable.

Figure 6:
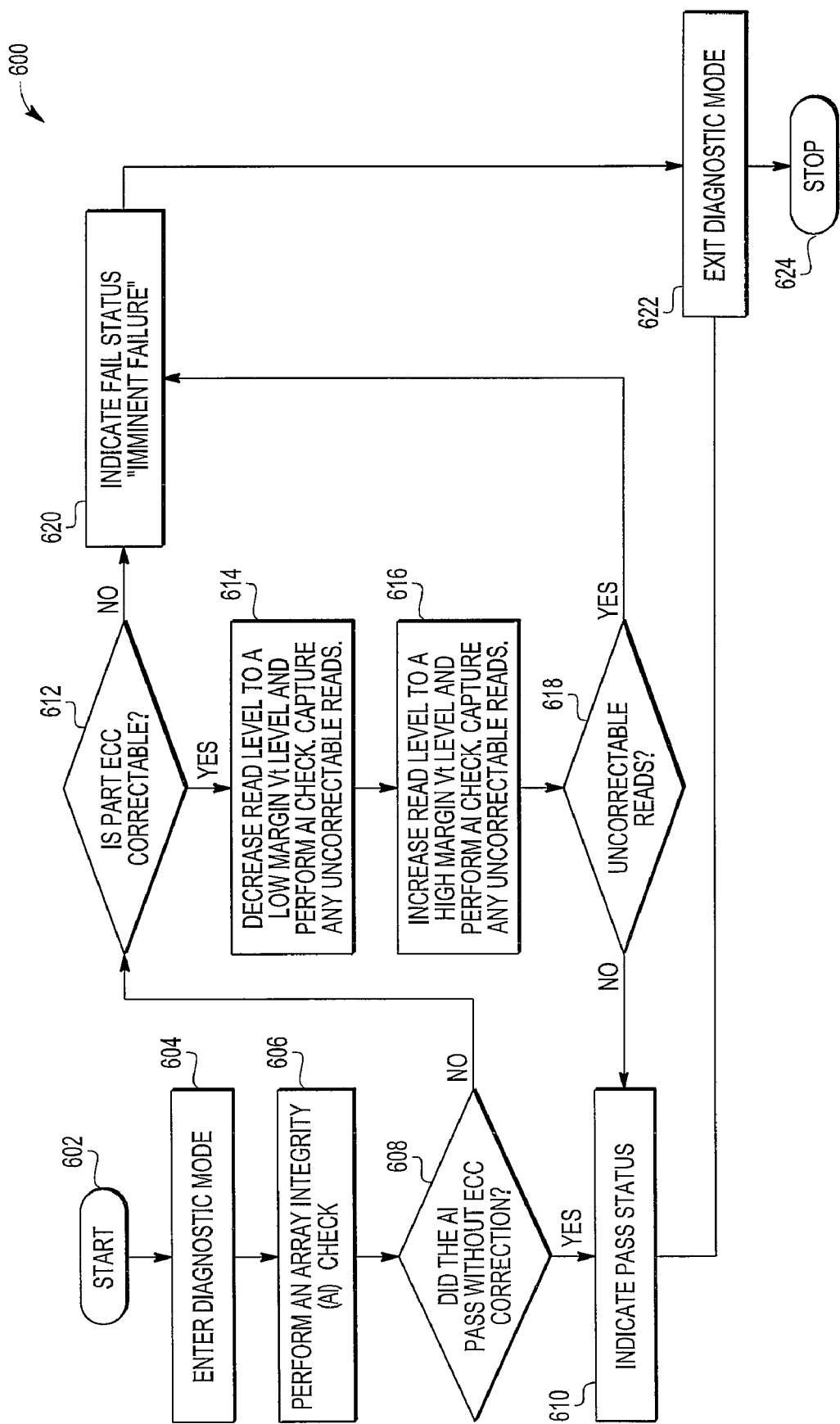
FIG. 6 is a flowchart of a process for detecting an imminent read failure in a memory array according to one embodiment of the present invention.

With reference to FIG. 6, a process 600 is illustrated that implements threshold voltage techniques for detecting an imminent read failure in a memory array. The process 600 is initiated in block 602, at which point control transfers to block 604, when a diagnostic mode is entered (e.g., by being selected by a technician, at power-up, and/or periodically). From block 604 control transfers to block 606 where an array integrity (AI) check is performed at a normal read verify voltage level. As noted above, an AI check may be implemented by a circuit that includes an address sequencer, an ECC circuit, and a threshold voltage level adjuster. In this case, the address sequencer is used to read all locations within the memory array. For example, the AI check may be performed by implementing (in conjunction with the address sequencer) a multiple input signature register (MISR), which performs an algorithm on a sequence of read data to provide signatures for the sequence of read data at various times. The AI check then compares subsequent signatures of the sequence of read data (when read at a later point in time) to an initial signature to identify read failures. As noted above, the ECC circuit identifies whether a read needed a correction to pass (as well as identifying whether a read could not be corrected due to too many failures in an ECC word checkbase). As is discussed in further detail below, the threshold voltage level adjuster is then used to perform a read at one or more margin read verify voltage levels.

Next, in decision block 608, the process 600 determines whether the AI check passed without ECC correction. If the AI check passed in block 608 without ECC correction (as, for example, indicated by an ECC flag), control transfers to block 610 where a pass status is indicated. If the AI check did not pass in block 608 without ECC correction, control transfers to decision block 612, where the process 600 determines whether the part is ECC correctable (as, for example, indicated by an ECC flag). If the part is not ECC correctable in block 612, control transfers to block 620 where a fail status is indicated.

If the part is ECC correctable in block 612, control transfers to block 614 where a read level is decreased to a low margin threshold voltage and another AI check is performed. In block 614, any uncorrectable reads are captured. Next, in block 616, a read level is increased to a high margin threshold voltage and yet another AI check is performed. In block 616, any uncorrectable reads are captured. Then, in decision block 618, the process 600 determines whether any uncorrectable reads were captured in blocks 614 and 616. If no uncorrectable reads were captured in blocks 614 and 616, control transfers from block 618 to block 610. If uncorrectable reads were captured in blocks 614 or 616, control transfers from block 618 to block 620. Following blocks 610 and 620, control transfers to block 622 (where the diagnostic mode is exited) and then to block 624 (where control returns to a calling process and the process 600 is terminated). It should be appreciated that only one of blocks 614 and 616 may be implemented or the execution order of the blocks 614 and 616 may be reversed, if desired. Depending on the technology, margin reads may be employed to detect an imminent read failure without first detecting a correctable read at a normal read verify voltage level. According to this aspect of the present disclosure, the ECC is utilized to detect an uncorrectable read at a margin read verify voltage level.

In lower cost implementations (e.g., in parts that do not offer a margin threshold voltage (Vt) verify read capability), a time-based technique may be implemented to determine if memory array integrity is getting worse over time. According to this aspect of the present disclosure, a circuit is implemented to detect when a first ECC correction is made and record the number of ECC corrections needed (e.g., single digits for bit flips or hundreds of bits for column or sense amplifier failures). The circuit then determines if the number of corrections increase above a predetermined amount over time. For example, in an NVM that includes sixteen million bit cells, the predetermined amount may correspond to tens or hundreds of additional bits that required correction. In general, the predetermined amount is dependent on a memory size. In one embodiment, the circuit includes an address sequencer, an ECC circuit, and a storage location. The address sequencer is configured to read all locations within the memory array. The ECC circuit identifies whether a read needed a correction to pass and whether a read could not be corrected due to too many failures in an ECC word checkbase. The storage location is used to store the number of corrected bits in ECC word checkbases of the memory array for a first ECC event (i.e., when the ECC is first utilized to correct a read).

Figure 7:
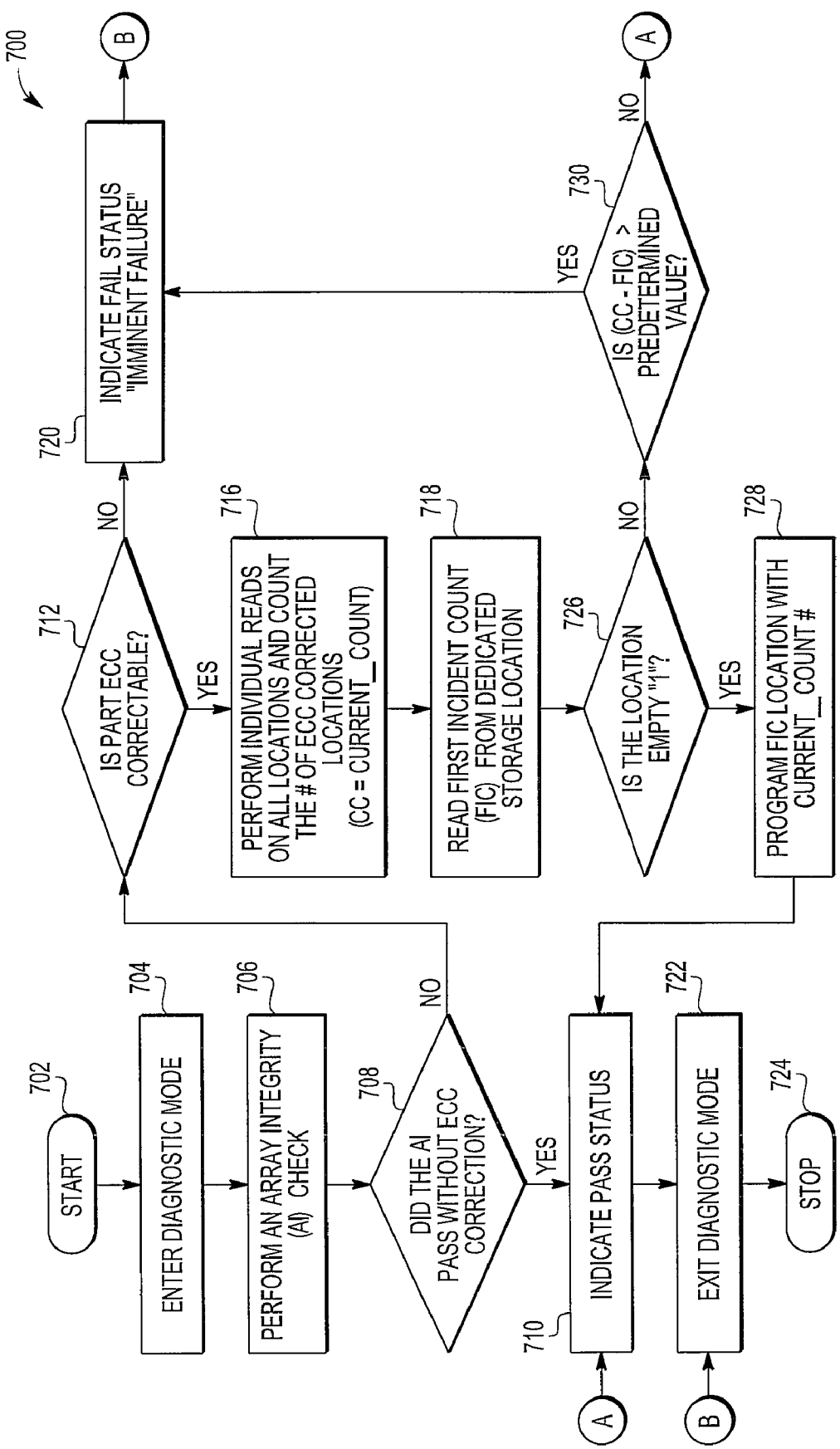
FIG. 7 is a flowchart of another process for detecting an imminent read failure in a memory array according to another embodiment of the present invention.

With reference to FIG. 7, a process 700 is illustrated that implements time-based techniques for detecting an imminent read failure in a memory array. The process 700 is initiated in block 702, at which point control transfers to block 704, when a diagnostic mode is entered (e.g., by being selected by a technician, at power-up, and/or periodically). From block 704 control transfers to block 706 where an array integrity (AI) check is performed. As noted above, an AI check may be implemented by a circuit that includes an address sequencer, an ECC circuit, and a storage location (e.g., a non-volatile storage location). The AI check may be performed at a normal read verify voltage level or a margin read verify voltage level. When implemented, the address sequencer is used to read all locations within the memory array. For example, the AI check may be performed by implementing (in conjunction with the address sequencer) a multiple input signature register (MISR), which performs an algorithm on a sequence of read data to provide signatures for the sequence of read data at various times. The AI check then compares subsequent signatures of the sequence of read data (when read at a later point in time) to an initial signature to identify read failures. As noted above, the ECC circuit identifies whether a read needed a correction to pass (as well as identifying whether a read could not be corrected due to too many failures in an ECC word checkbase). The storage location is then used to store a read first incident count (FIC) that corresponds to a number of bits that first required ECC correction in the memory array (i.e., an empty storage location indicates a FIC).

Next, in decision block 708, the process 700 determines whether the AI check passed without ECC correction. If the AI check passed in block 708 without ECC correction, control transfers to block 710 where a pass status is indicated. If the AI check did not pass in block 708 without ECC correction, control transfers to decision block 712, where the process 700 determines whether the part is ECC correctable (as, for example, indicated by an ECC flag). If the part is not ECC correctable in block 712, control transfers to block 720 where a fail status is indicated.

If the part is ECC correctable in block 712, control transfers to block 716 where individual reads are performed on all memory array locations and a count of the number of ECC corrected locations is obtained (CC=Current_Count). Next, in block 718 the FIC is read from the storage location. Then, in decision block 726, the process 700 determines whether the storage location is empty. If the storage location is empty in block 726, control transfers from block 726 to block 728, where the FIC storage location is programmed with the number held in the variable Current_Count. Next, control transfers from block 728 to block 710. If the storage location is not empty in block 726, control transfers from block 726 to decision block 730, where the process 700 determines whether the difference between the Current_Count and the FIC is greater than a predetermined value. If the difference between the Current_Count and the FIC is greater than the predetermined value in block 730, control transfers to block 720. If the difference between the Current_Count and the FIC is not greater than the predetermined value in block 730, control transfers to block 710. From block 710, control transfers to block 722 (where the diagnostic mode is exited) and then to block 724 (where control returns to a calling process and the process 700 is terminated).

Accordingly, various techniques have been disclosed herein that detect an imminent uncorrectable read situation for a memory array prior to an actual occurrence of an uncorrectable read situation. The techniques advantageously provide an accurate indication of when a part is actually defective and reduces the number of non-defective parts returned to a vendor.

As may be used herein, a software system can include one or more objects, agents, threads, subroutines, separate software applications, two or more lines of code or other suitable software structures operating in one or more separate software applications, on one or more different processors, or other suitable software architectures.

As will be appreciated, the processes in preferred embodiments of the present invention may be implemented using any combination of computer programming software, firmware or hardware. As a preparatory step to practicing the invention in software, the computer programming code (whether software or firmware) according to a preferred embodiment will typically be stored in one or more machine readable storage mediums such as fixed (hard) drives, diskettes, optical disks, magnetic tape, semiconductor memories such as read-only memories (ROMs), programmable ROMs (PROMs), etc., thereby making an article of manufacture in accordance with the invention. The article of manufacture containing the computer programming code is used by either executing the code directly from the storage device, or by copying the code from the storage device into another storage device such as a hard disk, random access memory (RAM), etc. The method form of the invention may be practiced by combining one or more machine-readable storage devices containing the code according to the present invention with appropriate standard computer hardware to execute the code contained therein.

Although the invention is described herein with reference to specific embodiments, various modifications and changes can be made without departing from the scope of the present invention as set forth in the claims below. For example, many of the techniques disclosed herein are broadly applicable to a variety of memory technologies employed in various systems. Accordingly, the specification and figures are to be regarded in an illustrative rather than a restrictive sense, and all such modifications are intended to be included within the scope of the present invention. Any benefits, advantages, or solution to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of detecting an imminent read failure in a memory array, comprising:
    determining a first incident count for the memory array that does not exhibit an uncorrectable error correcting code (ECC) read during an array integrity check, wherein the first incident count corresponds to an initial number of ECC corrections that are performed when the array integrity check of the memory array initially fails;
    determining a current count for the memory array when the memory array does not exhibit an uncorrectable ECC read during subsequent array integrity checks, wherein the current count corresponds to a subsequent number of error correcting code (ECC) corrections required during the subsequent array integrity checks; and
    providing an indication of an imminent read failure for the memory array when the current count exceeds the first incident count by a predetermined amount.

2. The method of claim 1, further comprising:
    storing the first incident count in a storage location.

3. The method of claim 1, further comprising:
    indicating a pass status when the memory array passes the array integrity check without ECC correction.

4. The method of claim 1, further comprising:
    indicating a pass status when the current count does not exceed the first incident count by the predetermined value.

5. The method of claim 1, further comprising:
    performing the array integrity check on the memory array at a normal read verify voltage level.

6. The method of claim 1, wherein the memory array is a non-volatile memory array.

7. A method of detecting an imminent read failure in a memory array, comprising:
    determining whether an array integrity check on the memory array passed without using error correcting code (ECC) correction;
    determining, when the array integrity check on the memory array did not pass without using the ECC correction, whether the memory array is ECC correctable;
    determining, when the memory array is ECC correctable, a first incident count for the memory array, wherein the first incident count corresponds to an initial number of ECC corrections that are performed when the array integrity check of the memory array initially fails;
    determining, while the memory array is ECC correctable, a current count for the memory array during subsequent array integrity checks, wherein the current count corresponds to a subsequent number of error correcting code (ECC) corrections required during the subsequent array integrity checks; and
    providing an indication of an imminent read failure for the memory array when the current count exceeds the first incident count by a predetermined amount.

8. The method of claim 7, further comprising:
    storing the first incident count in a non-volatile storage location.

9. The method of claim 7, further comprising:
    indicating a pass status when the memory array passes the array integrity check without ECC correction.

10. The method of claim 7, further comprising:
    indicating a pass status when the current count does not exceed the first incident count by the predetermined value.

11. The method of claim 7, further comprising:
    performing the array integrity check on the memory array at a normal read verify voltage level.

12. The method of claim 11, further comprising:
    indicating a pass status when the memory array passes the array integrity check without ECC correction.

13. The method of claim 7, further comprising:
    indicating a fail status when the memory array is not ECC correctable.

14. The method of claim 7, wherein the memory array is a non-volatile memory array.

15. A memory system, comprising:
    a non-volatile memory array; and
    a circuit coupled to the non-volatile memory array, wherein the circuit is configured to:
    determine whether an array integrity check on the memory array passed without using error correcting code (ECC) correction;
    determine, when the array integrity check on the memory array did not pass without using the ECC correction, whether the memory array is ECC correctable;
    determine, when the memory array is ECC correctable, a first incident count for the memory array, wherein the first incident count corresponds to an initial number of ECC corrections that are performed when the array integrity check of the memory array initially fails;
    determine, while the memory array is ECC correctable, a current count for the memory array during subsequent array integrity checks, wherein the current count corresponds to a subsequent number of error correcting code (ECC) corrections required during the subsequent array integrity checks; and
    provide an indication of an imminent read failure for the memory array when the current count exceeds the first incident count by a predetermined amount.

16. The memory system of claim 15, wherein the circuit is further configured to:
    store the first incident count in a non-volatile storage location.

17. The memory system of claim 15, wherein the circuit is further configured to:
   indicate a pass status when the memory array passes the array integrity check without ECC correction.

18. The memory system of claim 15, wherein the circuit is further configured to:
   indicate a fail status when the memory array is not ECC correctable.

19. The memory system of claim 15, wherein the circuit is further configured to:
   indicate a pass status when the current count does not exceed the first incident count by the predetermined value.

20. The memory system of claim 15, wherein the circuit is further configured to:
   perform the array integrity check on the memory array at a normal read verify voltage level.

\* \* \* \* \*